(12) United States Patent
Lai et al.

(10) Patent No.: US 10,141,301 B2
(45) Date of Patent: Nov. 27, 2018

(54) CROSS-DOMAIN ESD PROTECTION

(71) Applicant: NXP B.V., Eindhoven (NL)

(72) Inventors: Da-Wei Lai, Nijmegen (NL); Taede Smedes, Nijmegen (NL)

(73) Assignee: NXP B.V., Eindhoven (NL)

( * ) Notice: Subject to any disclaimer, the term of this patent is extended or adjusted under 35 U.S.C. 154(b) by 291 days.

(21) Appl. No.: 15/237,324

(22) Filed: Aug. 15, 2016

(65) Prior Publication Data

US 2018/0047720 A1 Feb. 15, 2018

(51) Int. Cl.
*H01L 27/02* (2006.01)
*H02H 9/04* (2006.01)

(52) U.S. Cl.
CPC ...... *H01L 27/0296* (2013.01); *H01L 27/0251* (2013.01); *H01L 27/0255* (2013.01); *H01L 27/0266* (2013.01); *H01L 27/0292* (2013.01); *H02H 9/045* (2013.01)

(58) Field of Classification Search
USPC .................................................. 361/56, 111
See application file for complete search history.

(56) References Cited

U.S. PATENT DOCUMENTS

| | | | |
|---|---|---|---|
| 6,369,994 | B1 | 4/2002 | Voldman |
| 7,817,386 | B2 | 10/2010 | Ker et al. |
| 2009/0097174 | A1 | 4/2009 | Ker et al. |
| 2011/0255200 | A1 | 10/2011 | Tsai et al. |
| 2012/0154962 | A1* | 6/2012 | Russ ...................... H02H 9/046 361/56 |
| 2012/0300349 | A1* | 11/2012 | Abou-Khalil .......... H02H 9/046 361/56 |
| 2013/0235498 | A1* | 9/2013 | Lai ................... H03K 19/00315 361/56 |
| 2013/0286516 | A1 | 10/2013 | Prabhu et al. |

OTHER PUBLICATIONS

Okushima, M., "ESD Protection Design for Mixed-Power Domains in 90nm CMOS with New Efficient Power Clamp and GND Current Trigger (GCT) Technique," Core Development Division, NEC Electronics Corporation, EOS/ESD Symposium, p. 6.205-6.213.
Chen, Shih-Hung, et al., "Local CDM ESD Protection Circuits for Cross-Power Domains in 3D IC Applications," IEEE Transactions on Device and Materials Reliability, vol. 14, No. 2, Jun. 2014, p. 781-783.
Yoon Huh, P., ESD-induced Internal Core Device Failure: New Failure Modes in System-on-Chip (SOC) Designs, Proceeding of the 9th International Database Engineering & Application Symposium (IDEAS'05), IEEE 2005.

* cited by examiner

*Primary Examiner* — Danny Nguyen (57) ABSTRACT

Semiconductor devices with cross-domain electrostatic discharge (ESD) protection and related fabrication methods are provided. An exemplary semiconductor device includes first domain circuitry, second domain circuitry, and an interface coupled between an output node of the first domain driver circuitry and second domain receiver circuitry. The receiver circuitry includes a transistor having a gate electrode coupled to the interface, with a body electrode of the transistor being coupled to protection circuitry of the first domain circuitry. The body electrode is effectively biased to a reference voltage node of the first domain by the protection circuitry in response to an ESD event to protect the gate oxide of the transistor from a potentially damaging ESD voltage.

19 Claims, 3 Drawing Sheets

FIG. 4

CROSS-DOMAIN ESD PROTECTION

TECHNICAL FIELD

Embodiments of the subject matter described herein relate generally to semiconductor devices, and more particularly, embodiments of the subject matter relate to providing electrostatic discharge protection across different power domains.

BACKGROUND

Modern electronic devices, and particularly, integrated circuits, are at risk of damage due to electrostatic discharge (ESD) events. During an ESD event, a voltage (or current) may be provided to one or more terminals of an electronic device that causes the voltage between those terminals (or other terminals of the electronic device) to exceed the designed maximum voltage of the device, which could impair subsequent operation of the device. For example, a voltage at a terminal of an electronic device during an ESD event may exceed the breakdown voltage of one or more components of the device, and thereby potentially damage those components. Accordingly, electronic devices include discharge protection circuitry that provides protection from excessive voltages and/or currents across electrical components during ESD events.

Modern electronic devices often include multiple different subsystems or subcircuits that are integrated into a single device to provide complex and/or broad ranges of functional capabilities, such as, for example, a system on a chip (SoC). In practice, different subcircuits may have different component sizes, performance requirements, and the like, and as such, may be designed for different voltage levels relative to other subcircuits of the device, resulting in different so-called "power domains" within a device. To achieve the desired functionality, circuitry from different power domains needs to be able to communicate signals to/from one power domain to another power domain. However, the interfaces between different power domains are susceptible to ESD voltages, which may propagate from one voltage (or power) domain, alternatively referred to as the transmitting or transmitter domain, to another voltage (or power) domain, alternatively referred to as the receiving or receiver domain, and thereby damage one or more components of the receiver domain.

One approach to protecting a cross-domain communications interface involves introducing a series resistance and clamping circuit that reduces ESD voltage at the receiver power domain and conducts discharge current away from the receiver power domain. However, the resistance and clamping circuitry create a filter that limits the bandwidth of the communications interface. Accordingly, other approaches attempt to provide other configurations of clamping circuits triggered by other available voltages to avoid interfering with normal operation of the communications interface. However, such approaches are often susceptible to noise and require undesirably-sized transistors to avoid ESD-related damage.

To avoid interfering with normal operation of the device being protected, the discharge protection circuitry is typically designed to turn on and conduct current when the applied voltage exceeds the operating voltage of the device but before the applied voltage exceeds the breakdown voltage of the device. However, there is often a period of time between when the applied voltage exceeds the operating voltage of the device and when the applied voltage reaches the transient triggering voltage that fully turns on the discharge protection circuitry. During this time, the components of the device may be exposed to a portion of the discharge current, which, in turn, could undesirably impact the functionality of the components in the future. Existing approaches often involve tuning the breakdown voltages of the discharge protection circuitry to achieve the desired ESD performance; however, this often incurs area penalties or otherwise increases costs associated with the discharge protection circuitry.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

DETAILED DESCRIPTION

Embodiments of the subject matter described herein generally relate to circuitry configured to provide electrostatic discharge (ESD) protection for devices connected to a cross-domain communications interface. The ESD protection is provided in a manner that does not constrain the communications frequency associated with the interface, while further minimizing any area or cost penalty incurred by protecting the communications interface from an ESD event on one of the power domains. In exemplary embodiments, the output node of the ESD triggering arrangement associated with a transmitting power domain is used to bias the body electrode of a transistor of the interface circuitry associated with the receiving power domain to reduce the voltage across the transistor during an ESD event. In this regard, the source and body electrodes of the transistor of the receiver interface circuitry having its gate electrode connected to the cross-domain communications interface may be pulled up to the ESD voltage on the transmitting power domain, which, in turn prevents the voltage on the cross-domain communications interface from creating a voltage differential relative to the body voltage that could otherwise damage the gate oxide of the transistor. For purposes of explanation, the transistor back-gate biased to the triggering arrangement output node may alternatively be referred to herein as the protected transistor.

Additionally, in exemplary embodiments, an auxiliary switching arrangement is provided between the protected transistor and the ground reference voltage node on the receiving power domain, which is operable to disable, prevent or otherwise reduce discharge current through the transistor of the receiver interface circuitry. For example, the auxiliary switching arrangement may be realized as a transistor having its gate electrode connected to a triggering node of the ESD triggering arrangement that corresponds to the logical inverse of the signal at the output node. Thus, in response to an ESD event when the signal at the output node of the triggering arrangement corresponds to a logical high voltage value, the triggering node corresponds to a logical low voltage value that deactivates, disables, opens, or otherwise turns off the auxiliary transistor, and thereby prevents current flow between the protected transistor and the ground reference voltage node. In exemplary embodiments, the drain of the auxiliary transistor is connected to the body and source of the protected transistor and provides a higher reverse breakdown voltage by virtue of being turned off, thereby supporting raising the body voltage of the protected transistor relative to the gate of the protected transistor to protect from gate oxide breakdown. Conversely, in the absence of an ESD event when the signal at the output node of the triggering arrangement corresponds to a logical low voltage value, the triggering node corresponds to a logical high voltage value that activates, enables, closes or otherwise turns on the auxiliary transistor. When turned on, the auxiliary transistor enables current flow between the transistor of the receiver interface circuitry and the ground reference voltage node and pulls the body and source electrodes of the transistor of the receiver interface circuitry to the ground reference voltage in conjunction with the logical low triggering arrangement output voltage.

By virtue of back-gate biasing the protected transistor to the ESD voltage in conjunction with the auxiliary transistor, ESD current is not conducted by the receiver interface circuitry, but rather flows through the ESD protection circuitry associated with the transmitting power domain. Thus, the dimensions and characteristics of the transistors do not need to be increased to accommodate ESD currents, thereby limiting the area or cost penalties associated with providing ESD protection for the cross-domain communications interface to those associated with provision of the auxiliary transistor. In this regard, in embodiments where a switching arrangement for disconnecting the receiving power domain from the ground rails, the switching arrangement may be utilized as the auxiliary switching arrangement controlled by the triggering node of the transmitting power domain ESD protection circuitry, thereby avoiding the need for any additional devices beyond those already present in the receiver interface circuitry.

Figure 1:
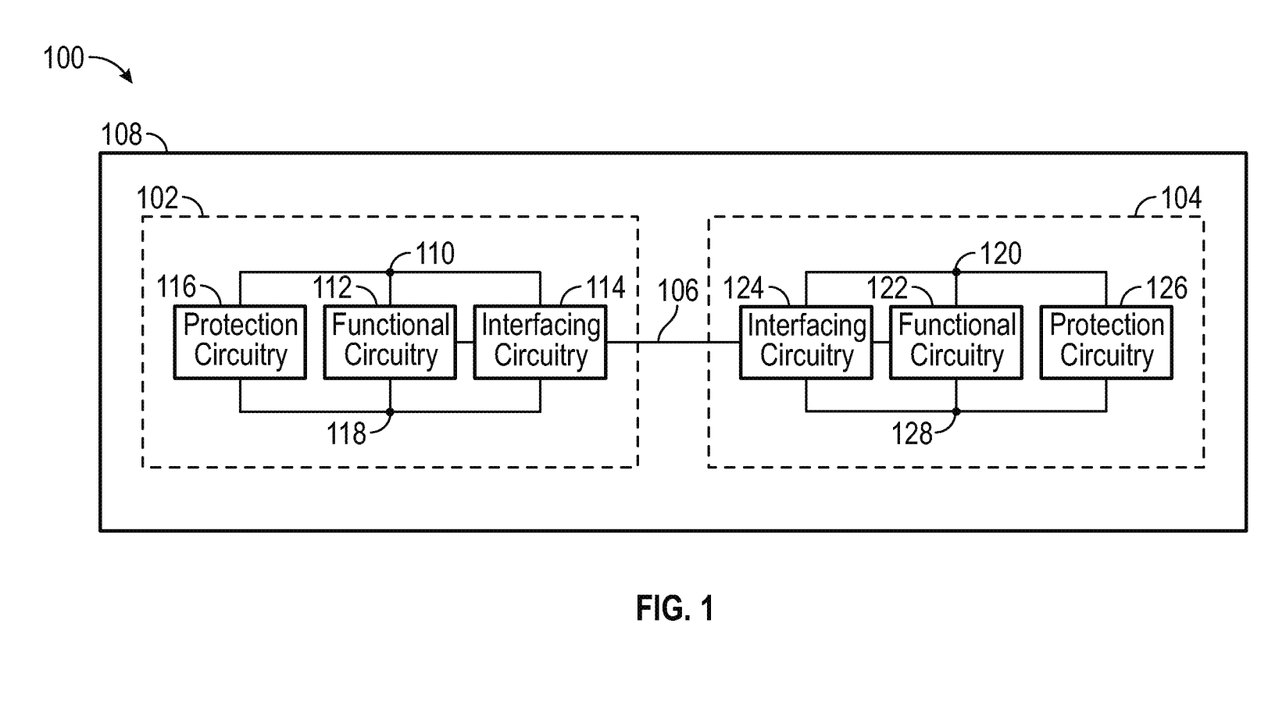
FIG. 1 depicts a block diagram of a semiconductor device including different power domain circuitry in accordance with one or more embodiments of the invention.

FIG. 1 depicts a block diagram of an exemplary semiconductor device 100 in accordance with one or more exemplary embodiments of the present invention. The semiconductor device 100 includes a first set of circuitry 102 associated with a first power domain that communicates with a second set of circuitry 104 associated with a second power domain via a communications interface 106. The subject matter is described herein in the context of the first power domain circuitry 102 transmitting or otherwise providing signals to the second power domain circuitry 104, and accordingly, for purposes of explanation but without limitation, the first power domain circuitry 102 is alternatively referred to herein as the transmitting domain circuitry and the second power domain circuitry 104 is alternatively referred to herein as the receiver domain circuitry. In exemplary embodiments, the transmitter and receiver domain circuitry 102, 104 are fabricated on a common semiconductor substrate 108 and encapsulated in a common device package to obtain the semiconductor device 100.

It should be understood that FIG. 1 is a simplified representation of the semiconductor device 100 for purposes of explanation and ease of description, and FIG. 1 is not intended to limit the application or scope of the subject matter in any way. Thus, although FIG. 1 depicts direct electrical connections between components, alternative embodiments may employ intervening circuit elements and/or components while functioning in a substantially similar manner. Practical embodiments of the semiconductor device 100 will also include one or more input/output (I/O) interfaces (e.g., pins, pads, terminals, or the like) configured to support communications between external devices, components or systems and the internal circuitry 102, 104 of the semiconductor device 100. Additionally, it should be noted the subject matter is not limited to the transmitter and receiver domain circuitry 102, 104 being fabricated on a common semiconductor substrate, and in other embodiments, the transmitter and receiver domain circuitry 102, 104 may be fabricated on separate dies that are soldered, affixed, or otherwise mounted to a package substrate (e.g., a lead frame, circuit board, or the like) before encapsulation, or furthermore, the transmitter and receiver domain circuitry 102, 104 may be packaged separately as part of discrete devices.

In the illustrated embodiment, the transmitter domain circuitry 102 includes, without limitation, functional circuitry 112, interfacing circuitry 114, and protection circuitry 116, with each being coupled between a first reference voltage node 110 and a second reference voltage node 118. The first reference voltage node 110 may be coupled to an I/O interface of the semiconductor device 100 to receive a positive direct current (DC) supply reference voltage for the transmitter domain circuitry 102, and the second reference voltage node 118 may be coupled to another I/O interface of the semiconductor device 100 to receive a ground (or negative supply) reference voltage for the transmitter domain circuitry 102.

The functional circuitry 112 generally represents the components of the semiconductor device 100 configured to provide a desired functionality for the transmitter domain 102. Depending on the embodiment, the functional circuitry 112 may be realized as any suitable combination of processing circuitry (e.g., one or more processing cores, processors, controllers, microcontrollers, microprocessors, or the like), logic circuitry, memories or other data storage elements, discrete components, analog and/or digital components, or other hardware components and/or circuitry configured to provide a desired functionality for the transmitter domain 102. An output of the functional circuitry 112 is connected to the input of interfacing circuitry 114, which, in turn, is configured to generate a corresponding output signal at an output node connected to the communications interface 106 and thereby communicate an output signal from the functional circuitry 112 to the receiver domain circuitry 104 via the interfacing circuitry 114. The communications interface 106 generally represents a conductive trace, wire, or other conductive element capable of transmitting electrical signals. In this regard, the interfacing circuitry 114 generally represents an output driver, buffer, or other suitable circuitry configured to transmit or otherwise provide an electrical signal on the communications interface 106 corresponding to the output of the functional circuitry 112.

The protection circuitry 116 generally represents the components of the transmitter domain circuitry 102 configured to detect or otherwise identify an ESD event and conduct a discharge current between the supply and ground reference voltage nodes 110, 118 of the transmitter domain circuitry 102, and thereby protect the functional circuitry 112 and interfacing circuitry 114 from a potentially damaging discharge current within the transmitter domain or through one or more input/output interfaces coupled to the transmitter domain (e.g., I/O pins associated with the functional circuitry 112 or other components of the transmitter domain circuitry 102). As described in greater detail below in the context of FIG. 2, in exemplary embodiments, the protection circuitry 116 includes a triggering arrangement configured to detect or otherwise identify an ESD event based on a voltage at one of the reference voltage nodes 110, 118 and provide corresponding indication at an output node coupled to a clamping arrangement that is configured to conduct current between the reference voltage nodes 110, 118 in response to the indication and thereby clamp the voltage difference between the reference voltage nodes 110, 118 to the voltage across the clamping arrangement.

Still referring to FIG. 1, the receiver domain circuitry 104 similarly includes, without limitation, functional circuitry 122, interfacing circuitry 124, and protection circuitry 126, with each being coupled between a third reference voltage node 120 and a fourth reference voltage node 128. The third reference voltage node 120 is configured to receive a positive DC supply reference voltage for the receiver domain circuitry 102, and the fourth reference voltage node 128 is configured to receive a ground (or negative supply) reference voltage for the receiver domain circuitry 104. In this regard, at least one of the reference voltage nodes 120, 128 is not directly connected to a corresponding reference voltage node 110, 118 of the transmitter domain circuitry 102. Depending on the embodiment, the voltage difference between the reference voltage nodes 120, 128 of the receiver domain circuitry 104 can be the same as or different from the voltage difference between the reference voltage nodes 110, 118 of the transmitter domain circuitry 102. In other words, when the ground reference voltage nodes 118, 128 have substantially the same reference voltage, the receiver supply reference voltage at node 120 can be the same as or different from the transmitter supply reference voltage at node 110. For example, the receiver supply reference voltage at node 120 may be less than the transmitter supply reference voltage at node 110, so that the components of the receiver domain circuitry 104 may be designed and fabricated with dimensions and characteristics suitable for operation at a lower voltage level and/or with reduced power handling capabilities relative to the components of the transmitter domain circuitry 102. In such embodiments, the transmitter domain may alternatively be referred to as the higher voltage or higher power domain, while the receiver domain may be referred to as the lower voltage or lower power domain. That said, it will be appreciated that the subject matter described herein is not limited to any particular arrangement or configuration of voltage or power levels between the two different communicating power domains to be protected from an ESD event.

In a similar manner as described above, the functional circuitry 122 generally represents the components of the semiconductor device 100 configured to provide a desired functionality for the receiver domain 104. An input of the functional circuitry 122 is connected to the output of interfacing circuitry 124, which, in turn, is configured to generate a input signal at an output node corresponding to a signal on the communications interface 106 and thereby communicate an output signal from the transmitter functional circuitry 112 to the receiver functional circuitry 122 via the interface 106. In this regard, the interfacing circuitry 124 generally represents a receiver buffer, or other suitable circuitry configured to receive or otherwise pass an electrical signal on the communications interface 106 corresponding to the output of the transmitter functional circuitry 112 to the receiver functional circuitry 122.

In the illustrated embodiment, the protection circuitry 126 generally represents the components of the receiver domain circuitry 104 configured to detect or otherwise identify an ESD event and conduct a discharge current between the supply and ground reference voltage nodes 120, 128 of the receiver domain circuitry 104. In this regard, by virtue of the protection circuitry 126 being separated from the communications interface 106 by the interfacing circuitry 124, an ESD current on the communications interface 106 could be conducted by the interfacing circuitry 124 rather than the protection circuitry 126 which, in turn, could potentially damage one or more components of the interfacing circuitry 124. Accordingly, as described in greater detail below in the context of FIG. 2, in exemplary embodiments, a protected component of the receiver interfacing circuitry 124 that could otherwise be subjected to the stress of an ESD event on the communications interface 106 is biased using the triggering arrangement of the transmitter protection circuitry 116 in a manner that prevents a potentially damaging ESD voltage across the protected component during an ESD event. Additionally, in exemplary embodiments, an auxiliary switching arrangement is incorporated into the receiver interfacing circuitry 124 or otherwise provided between the receiver interfacing circuitry 124 and the negative reference voltage node 128 and configured to prevent a potentially damaging ESD current through the protected component. Thus, by preventing the component from being subjected to an ESD event, the protected component can be designed in accordance with the desired functionality for the communications interface 106 rather than being modified to account for potential ESD voltages and/or currents.

Figure 2:
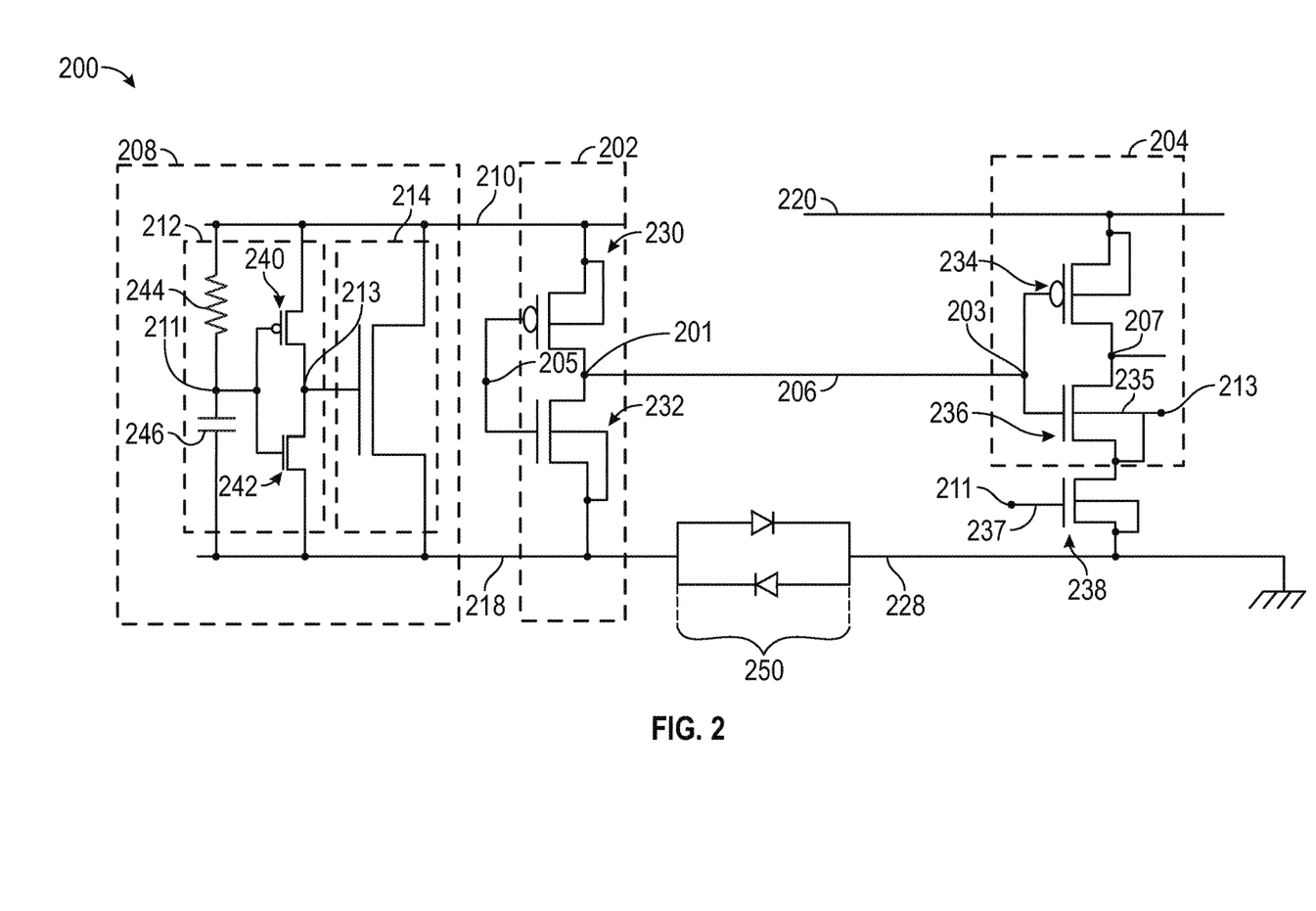
FIG. 2 depicts a schematic diagram of a cross-domain communications arrangement suitable for use in semiconductor device including a different power domains in accordance with one or more embodiments of the invention.

Referring now to FIG. 2, an exemplary cross-domain communications arrangement 200 includes transmitter interface circuitry 202 (e.g., interfacing circuitry 114) having an output node 201 coupled to an input node 203 of receiver interface circuitry 204 (e.g., interfacing circuitry 124) via a communications interface 206 (e.g., communications interface 106). The transmitter interface circuitry 202 is coupled between a transmitter supply reference voltage node 210 (e.g., transmitter reference voltage node 110) and a transmitter ground reference voltage node 218 (e.g., transmitter reference voltage node 118).

An input node 205 of the transmitter interface circuitry 202 is coupled to the output of transmitter functional circuitry (e.g., functional circuitry 112) coupled to nodes 210, 218, with the transmitter interface circuitry 202 being configured to generate an output signal at the output node 201 that corresponds to the input signal at input node 205. In an exemplary embodiment, the transmitter interface circuitry 202 is realized as an output driver including a pair of stacked transistors 230, 232 configured as an inverter. In this regard, the illustrated embodiment of FIG. 2 depicts the output driver as a complementary metal oxide semiconductor (CMOS) inverter. In such embodiments, a first transistor 230 of the CMOS inverter output driver is realized as a P-type (PMOS) transistor having source and body electrodes coupled to the transmitter supply reference voltage node 210, a drain electrode coupled to the output node 201, and a gate electrode coupled to the transmitter functional circuitry at input node 205. A second transistor 232 of the CMOS inverter output driver is realized as an N-type (NMOS) transistor having a drain electrode connected to the drain of the PMOS transistor 230 at the output node 201, source and body electrodes coupled to the transmitter ground reference voltage node 218, and a gate electrode coupled to the transmitter functional circuitry at input node 205.

The input node 203 of the receiver interface circuitry 204 is coupled to the communications interface 206 and configured to generate an output signal corresponding to the input signal at input node 203 at an output node 207 coupled to the input of receiver functional circuitry (e.g., functional circuitry 122) coupled between a receiver supply reference voltage node 220 (e.g., receiver reference voltage node 120) and a receiver ground reference voltage node 228 (e.g., receiver reference voltage node 128). The receiver interface circuitry 204 is realized as an input buffer including a pair of stacked transistors 234, 236. The illustrated embodiment of FIG. 2 depicts the input buffer as a CMOS inverter configured so that the output signal at the receiver interface output node 207 corresponds to the same logic level as the input signal at the driver interface input node 205. In this regard, a first transistor 234 of the input buffer may be realized as a PMOS transistor having source and body electrodes coupled to the receiver supply reference voltage node 220, a drain electrode coupled to the receiver functional circuitry at output node 207, and a gate electrode coupled to the communications interface 206 at input node 203. A second transistor 236 of the input buffer may be realized as an NMOS transistor having a drain electrode connected to the drain of the PMOS transistor 234 at the output node 207 and a gate electrode coupled to the communications interface 206 at the input node 203. The second transistor 236 corresponds to the protected transistor of the receiver interface circuitry 204. In this regard, a gate electrode of transistor 236 is otherwise capable of being exposed to a positive ESD voltage at the transmitter supply voltage node 210 relative to the receiver ground voltage node 228. Accordingly, a body electrode 235 of the second transistor 236 is biased to the ESD voltage in response to an ESD event to prevent a potentially damaging voltage difference between the gate electrode (or input node 203) and the body electrode 235 of transistor 236.

As described above, the transmitter power domain includes a protection arrangement 208 (e.g., protection circuitry 116) configured to conduct an ESD current between transmitter reference voltage nodes 210, 218 to protect the transmitter functional circuitry. The protection arrangement 208 includes a triggering arrangement 212 having an output node 213 coupled to a clamping arrangement 214 to activate, enable, or otherwise turn on the clamping arrangement 214 to conduct current in response to detecting an ESD event. For example, the clamping arrangement 214 may be realized as an NMOS transistor having a drain electrode connected to the transmitter supply voltage node 210, a source electrode connected to the transmitter ground supply voltage node 218, and a gate electrode connected to the output node 213 of the triggering arrangement 212 so that the NMOS transistor conducts current between the transmitter reference voltage nodes 210, 218 in response to a logical high voltage at the triggering output node 213. Accordingly, the illustrated triggering arrangement 212 includes a pair of stacked transistors 240, 242 configured as a CMOS inverter configured to pull the voltage at the inverter output (i.e., triggering output node 213) to the ESD voltage at the transmitter supply voltage node 210 in response to an ESD event. In this regard, the first transistor 240 of the triggering arrangement 212 may be realized as a PMOS transistor having source and body electrodes coupled to the transmitter supply reference voltage node 210, a drain electrode coupled to the output node 213, and a gate electrode coupled to a triggering input node 211 corresponding to the output of discharge detection circuitry 244, 246 coupled between the transmitter reference voltage nodes 210, 218. A second transistor 242 of the triggering arrangement 212 may be realized as an NMOS transistor having a drain electrode connected to the drain of the PMOS transistor 240 at the output node 213, source and body electrodes coupled to the transmitter ground reference voltage node 218, and a gate electrode coupled to the gate electrode of the PMOS transistor 240 at the triggering input node 211. It should be noted the subject matter is not limited to any particular triggering arrangement or topology, and there are numerous different circuits or techniques by which the triggering can be equivalently implemented.

The discharge detection circuitry 244, 246 is configured to provide a logical low voltage value at the input 211 to the inverter circuitry 240, 242 in response to an ESD event. This results in a logical high voltage value at the output 213 of the inverter circuitry 240, 242, which, in turn, activates the clamping arrangement 214 and biases the body electrode 235 of the protected transistor 236 to the current logical high voltage value of the transmitter power domain. The illustrated discharge detection circuitry includes a resistive element 244 coupled between the transmitter supply reference voltage node 210 and the triggering input node 211, and a capacitive element 246 coupled between the transmitter ground reference voltage node 218 and the triggering input node 211. During normal steady state operation, the capacitive element 246 is effectively an open circuit that supports voltage at the triggering input node 211 being at or near the transmitter reference voltage at node 210, resulting in a logical low voltage value at the output of the inverter circuitry 240, 242, thereby disabling the clamping arrangement 214 and biasing the body electrode 235 of the protected transistor 236 to the logical low voltage value. In this regard, in exemplary embodiments where the negative reference voltage nodes 218, 228 are coupled across power domains to provide a common ground reference voltage throughout the substrate, the body electrode 235 of the protected transistor 236 is biased to the receiver ground reference voltage at node 228, thereby enabling normal operation of the protected transistor 236. Additionally, as described in greater detail below, the logical high voltage value at the input 211 of the inverter circuitry 240, 242 also activates, enables, or otherwise turns on an auxiliary switching arrangement 238 to enable current flow through the protected transistor 236 to support normal operation of the receiver interface circuitry 204.

The resistance of the resistive element 244 and the capacitance of the capacitive element 246 are configured to detect or otherwise identify a voltage indicative of an ESD event when a transient voltage or current raises the voltage (or potential) of the transmitter positive reference voltage node 210 relative to the transmitter negative reference voltage node 218. For example, the resistive element 244 and the capacitive element 246 may be configured as a filter having a cutoff frequency such that a logical low voltage at the triggering input node 211 only occurs in response to a signal indicative of an ESD event having a frequency greater than a typical maximum frequency for the functional circuitry 112 and/or the voltage nodes 110, 118 during normal operation. Thus, in response to a rapid change in the voltage at the positive reference voltage node 210 that is indicative of an ESD event, the voltage at the triggering input node 211 is pulled to the transmitter ground reference voltage node 218 by the NMOS transistor 242 and the capacitive element 246, and the voltage at the triggering output node 213 is pulled to the voltage at the transmitter supply reference voltage node 210 by the PMOS transistor 240, thereby turning on the clamping NMOS transistor of the clamping arrangement 214.

The output node 213 of the triggering arrangement 212 is connected to the body electrode 235 of the protected transistor 236 (which is also connected to the source electrode of the protected transistor 236) to raise the body voltage (as well as the source voltage) of the protected transistor 236 to the ESD voltage at the transmitter supply reference node 210 (neglecting the drain-to-source voltage drop cross the PMOS transistor 240). Thus, in the event that the PMOS transistor 230 of the transmitter interface circuitry 202 is turned on to provide the ESD voltage to the communications interface 206, the biasing of the protected transistor 236 prevents a potentially damaging gate-to-body voltage differential across the gate oxide of the protected transistor 236 during an ESD event.

In exemplary embodiments, the receiver domain also includes a switching arrangement 238 configured to prevent ESD current between the protected transistor 236 and a receiver reference node 228. In this regard, a control terminal of the switching arrangement 238 is coupled to the triggering arrangement 212 so that the switching arrangement 238 is disabled, deactivated, opened or otherwise turned off in response to an ESD event. In the illustrated embodiment, the switching arrangement 238 is realized as an NMOS transistor having a drain terminal coupled to the source and body electrodes of the protected transistor and source and body terminals coupled to the receiver ground reference node 228. A gate electrode 237 of the NMOS transistor 238 is connected to the triggering input node 211, so that in response to the triggering arrangement 212 detecting an ESD event and pulling the triggering input node 211 to a logical low level to turn on the clamping arrangement 214, the NMOS transistor 238 is deactivated or otherwise turned off. Thus, the auxiliary switching transistor 238 acts to prevent current flow through the protected transistor 236 to/from the receiver ground reference node 228 during an ESD event.

Figure 3:
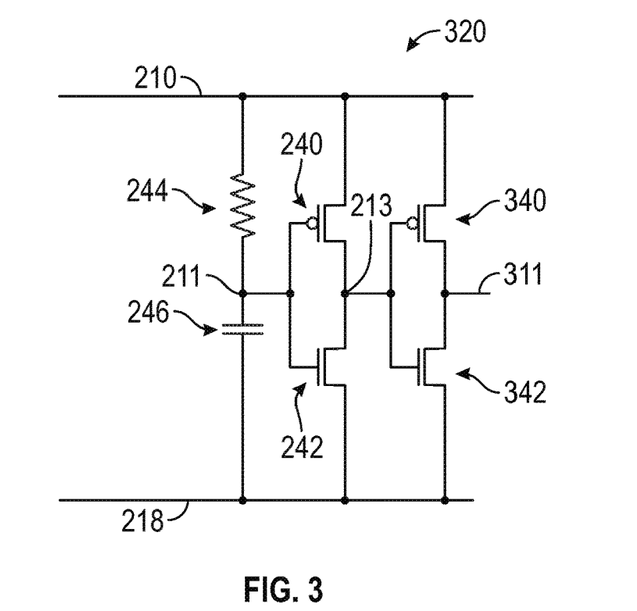
FIG. 3 depicts a schematic diagram of a triggering arrangement suitable for use in the cross-domain communications arrangement of FIG. 2 in accordance with one or more embodiments of the invention.

FIG. 3 depicts another embodiment of a triggering arrangement 300 suitable for use as the triggering arrangement 212 in FIG. 2. The illustrated triggering arrangement 300 includes an additional pair of stacked transistors 340, 342 configured as a CMOS inverter having its input coupled to the output node 213 of the preceding inverter arrangement 240, 242 so that the output node 311 of the second inverter arrangement 340, 342 corresponds to the logical inverse of the signal at the output node 213. In such embodiments, the output node 311 of the second inverter arrangement 340, 342 is connected to the gate electrode 237 of the auxiliary transistor 238, while the output node 213 of the first inverter arrangement 240, 242 is connected to the body electrode 235 of the protected transistor 236 and the drain of the auxiliary transistor 238. The triggering arrangement 300 depicted in FIG. 3 mitigates noise-induced false triggering of the auxiliary transistor 238 (which could undesirably prevent current through the receiver interface circuitry 204) relative to the triggering arrangement 212 depicted in FIG. 2.

Referring again to FIG. 2, in exemplary embodiments, the transmitter and receiver ground reference voltage nodes 218, 228 are coupled to one another via an antiparallel diode arrangement 250, so that the transmitter and receiver ground reference voltage nodes 218, 228 are substantially equal to one another during normal operation neglecting any voltage drop across the antiparallel diode arrangement 250. Thus, as described above, in response to an ESD event where the voltage at the transmitter supply voltage node 210 is positive relative to the ground reference voltage nodes 218, 228, the triggering arrangement 212 turns on the clamping arrangement 214 to conduct a discharge current through the clamping arrangement 214 to the receiver ground voltage node 228 via the antiparallel diode arrangement 250. The auxiliary transistor 238 prevents ESD current through the protected transistor 236 and the triggering output node 213 biases the body (or back gate) of the protected transistor 236 to prevent formation of an ESD voltage across the gate oxide of the protected transistor 236. Accordingly, in the event voltage or current attributable to an ESD event propagates to the communications interface 206, the protected transistor 236 is unlikely to be damaged.

Figure 4:
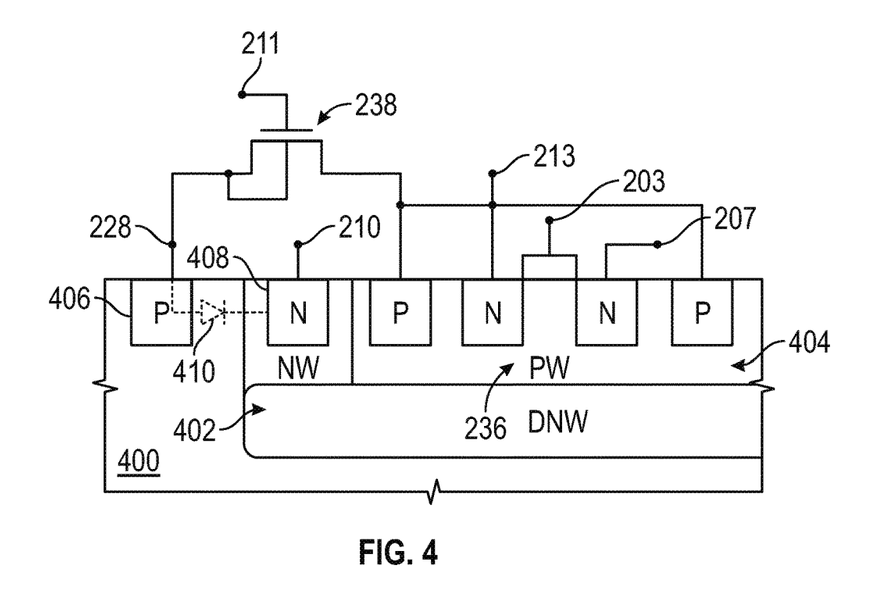
FIG. 4 depicts a cross-sectional view of a protected transistor fabricated on a bulk semiconductor substrate and suitable for use in the cross-domain communications arrangement of FIG. 2 in accordance with one or more embodiments of the invention.

Referring to FIG. 4, it should be noted that when the receiver interface circuitry 204 is fabricated on a bulk semiconductor substrate 400, an N-type isolation well region 402 is formed or otherwise provided around the P-type body well region 404 corresponding to the body electrode 235 of the protected transistor 236 to ensure isolation of the body electrode from the reference voltage node 228. For example, N-type regions 402 biased to one of the positive supply reference voltage nodes 210 may be formed underlying and laterally circumscribing the P-type body well region 404 of a protected NMOS transistor 236 to provide electrical isolation of the body electrode, with a conductive path being formed in an overlying interconnect layer to electrically connect the P-type body well regions to the triggering output node 213. In other embodiments, for receiver interface circuitry 204 fabricated on a silicon-on-insulator (SOI) semiconductor substrate or a similar substrate including an underlying isolation layer across the substrate, lateral isolation may be formed around the body well regions in a conventional manner to ensure lateral isolation from adjacent devices.

Referring to FIGS. 2 and 4, in response to an ESD event where the voltage at the receiver ground voltage node 228 is positive relative to the transmitter supply voltage node 210, a discharge current is conducted between domains by the antiparallel diode arrangement 250, with the respective domain protection circuitry 116, 126 providing protection for the functional and interfacing circuitry 112, 114, 122, 124. In this regard, for the embodiment depicted in FIG. 4, a relatively fast path for conducting the discharge current can also be achieved through the parasitic diode 410 between the substrate contact region 406 and the isolation well regions 402 (e.g., between the substrate contact region 406 and isolation well contact region 408), thereby alleviating ESD stress associated with an ESD voltage at the receiver ground voltage node 228 that is greater than the voltage at the transmitter supply voltage node 210.

By virtue of the subject matter described herein, a potentially vulnerable device communicating with another power domain can be protected from a potentially damaging voltage during an ESD event on that power domain by biasing the body of the protected device to the ESD voltage. Additionally, an auxiliary switching arrangement can be configured to prevent current flow through the protected device during an ESD event. As a result of the dual voltage and current protection, the design of the protected device does not need to be modified to account for ESD stress. Similarly, the biasing of the protected device can also act to prevent exposure of the auxiliary switching arrangement to potentially damaging voltage or current during an ESD event, which, in turn, facilitates minimizing any area or cost penalties that could otherwise be incurred by adding an auxiliary switching arrangement designed to accommodate ESD stresses.

For the sake of brevity, conventional techniques related to semiconductor and/or integrated circuit fabrication, transistors, biasing, device breakdown, ESD detection and protection, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the foregoing detailed description.

In conclusion, systems, devices, and methods configured in accordance with example embodiments of the invention relate to:

In one or more embodiments, an apparatus for a semiconductor device is provided. The semiconductor device comprises a triggering arrangement coupled to a first reference voltage node, the triggering arrangement having an output node for a triggering indication and interface circuitry coupled to a second reference voltage node different from the first reference voltage node, wherein the interface circuitry comprises a transistor having a body electrode biased to the output node of the triggering arrangement. In one embodiment, the triggering arrangement is configured to provide a discharge voltage at the output node in response to an electrostatic discharge event, wherein the body electrode is connected to the output node to bias the body electrode to the discharge voltage in response to the electrostatic discharge event. In another embodiment, the semiconductor device further comprises a second transistor coupled between the transistor and a third reference voltage node, wherein a gate electrode of the second transistor is biased to a triggering node of the triggering arrangement and the triggering indication at the output node is a logical inverse of a signal at the triggering node. In one embodiment, the triggering arrangement is configured to provide a logical low voltage at the triggering node in response to an electrostatic discharge event and the triggering indication comprises a logical high voltage at the output node. In another embodiment, the second transistor comprises a source electrode coupled to the third reference voltage node and a drain electrode coupled to the body electrode and the transistor comprises a drain electrode coupled to the second reference voltage node and a source electrode coupled to the body electrode. In one embodiment, the semiconductor device further comprises second interface circuitry coupled to the first reference voltage node, the second interface circuitry comprising a second output node coupled to an interface, wherein a gate electrode of the transistor is coupled to the interface. In another embodiment, the second interface circuitry comprises a third transistor having a source electrode coupled to the first reference voltage node, a gate electrode coupled to the output node of the triggering arrangement, and a drain electrode coupled to the second output node, and a fourth transistor having a drain electrode coupled to the second output node, a gate electrode coupled to the output node of the triggering arrangement, and a source electrode coupled to a fourth reference voltage node. In yet another embodiment, the semiconductor device further comprises an antiparallel diode arrangement coupled between the third reference voltage node and the fourth reference voltage node.

In another embodiment, a semiconductor device comprises first domain circuitry comprising protection circuitry coupled between a first reference voltage node and a second reference voltage node and driver circuitry coupled between the first reference voltage node and the second reference voltage node, the driver circuitry having an output node, an interface coupled to the output node of the driver circuitry, and second domain circuitry coupled between a third reference voltage node and a fourth reference voltage node, the second domain circuitry including a transistor having a gate electrode coupled to the interface, wherein a body electrode of the transistor is coupled to the protection circuitry. In one embodiment, a first voltage at the first reference voltage node is different from a second voltage at the third reference voltage node. In another embodiment, the semiconductor device further comprises a second transistor coupled between the body electrode of the transistor and the fourth reference voltage node, wherein a gate electrode of the second transistor is coupled to the protection circuitry. In one embodiment, the protection circuitry is configured to provide a first voltage corresponding to the first reference voltage node to the body electrode of the transistor and a second voltage corresponding to the second reference voltage node to the gate electrode of the second transistor in response to an electrostatic discharge event. In yet another embodiment, the semiconductor device further comprises an antiparallel diode arrangement coupled between the second reference voltage node and the fourth reference voltage node. In another embodiment, the second reference voltage node is coupled to the fourth reference voltage node. In another embodiment, the protection circuitry includes a clamping arrangement coupled between the first reference voltage node and the second reference voltage node, and the body electrode of the transistor is coupled to an input of the clamping arrangement. In one embodiment, the semiconductor device further comprises a second transistor coupled between the body electrode of the transistor and the fourth reference voltage node, wherein the protection circuitry comprises a triggering arrangement including inverter circuitry coupled between the first reference voltage node and the second reference voltage node, the inverter circuitry having an output coupled to the input of the clamping arrangement and a gate electrode of the second transistor is coupled to a second input of the inverter circuitry. In yet another embodiment, the triggering arrangement includes detection circuitry coupled between the first reference voltage node and the second reference voltage node and a second output of the detection circuitry is coupled to the second input of the inverter circuitry. In one embodiment, the semiconductor device further comprises an antiparallel diode arrangement coupled between the second reference voltage node and the fourth reference voltage node. In another embodiment, the second domain circuitry comprises receiver circuitry coupled between the third reference voltage node and the fourth reference voltage node and the receiver circuitry includes the transistor.

In yet another embodiment, a method of fabricating a semiconductor device comprises forming first domain circuitry on a semiconductor substrate, the first domain circuitry being coupled between a first reference voltage node and a second reference voltage node, forming a transistor of second domain circuitry on the semiconductor substrate, the second domain circuitry being coupled between a third reference voltage node and a fourth reference voltage node, forming a communications interface between an output node of driver circuitry of the first domain circuitry and a gate electrode of the transistor, providing an electrical connection between a body electrode of the transistor and a node of protection circuitry of the first domain circuitry. One embodiment of the method further comprises biasing the body electrode of the transistor to the node of the protection circuitry. Another embodiment of the method further comprises providing isolation in the semiconductor substrate around the body electrode.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A semiconductor device comprising:
   a triggering arrangement coupled to a first reference voltage node, the triggering arrangement having an output node for a triggering indication; and
   interface circuitry coupled to a second reference voltage node different from the first reference voltage node, wherein the interface circuitry comprises a transistor having a body electrode biased to the output node of the triggering arrangement;
   a second transistor coupled between the transistor and a third reference voltage node, wherein:
   a gate electrode of the second transistor is biased to a triggering node of the triggering arrangement; and
   the triggering indication at the output node is a logical inverse of a signal at the triggering node.

2. The semiconductor device of claim 1, the triggering arrangement being configured to provide a discharge voltage at the output node in response to an electrostatic discharge event, wherein the body electrode is connected to the output node to bias the body electrode to the discharge voltage in response to the electrostatic discharge event.

3. The semiconductor device of claim 1, wherein:
   the triggering arrangement is configured to provide a logical low voltage at the triggering node in response to an electrostatic discharge event; and
   the triggering indication comprises a logical high voltage at the output node.

4. The semiconductor device of claim 3, wherein:
   the second transistor comprises a source electrode coupled to the third reference voltage node and a drain electrode coupled to the body electrode; and
   the transistor comprises a drain electrode coupled to the second reference voltage node and a source electrode coupled to the body electrode.

5. The semiconductor device of claim 4, further comprising second interface circuitry coupled to the first reference voltage node, the second interface circuitry comprising a second output node coupled to an interface, wherein a gate electrode of the transistor is coupled to the interface.

6. The semiconductor device of claim 5, wherein the second interface circuitry comprises:
   a third transistor having a source electrode coupled to the first reference voltage node, a gate electrode coupled to the output node of the triggering arrangement, and a drain electrode coupled to the second output node; and
   a fourth transistor having a drain electrode coupled to the second output node, a gate electrode coupled to the output node of the triggering arrangement, and a source electrode coupled to a fourth reference voltage node.

7. The semiconductor device of claim 6, further comprising an antiparallel diode arrangement coupled between the third reference voltage node and the fourth reference voltage node.

8. A semiconductor device comprising:
   first domain circuitry comprising:
   protection circuitry coupled between a first reference voltage node and a second reference voltage node; the protection circuitry having an output node for providing a triggering indication, the protection circuitry configured to provide a discharge voltage at the output node in response to an electrostatic discharge event, wherein the output node biases a body electrode of a transistor to the discharge voltage in response to the electrostatic discharge event; and
   driver circuitry coupled between the first reference voltage node and the second reference voltage node, the driver circuitry having an output node;
   an interface coupled to the output node of the driver circuitry; and
   second domain circuitry coupled between a third reference voltage node and a fourth reference voltage node, the second domain circuitry including the transistor, the transistor having a gate electrode coupled to the interface to receive a signal via the interface.

9. The semiconductor device of claim 8, wherein a first voltage at the first reference voltage node is different from a second voltage at the third reference voltage node.

10. A semiconductor device comprising:
first domain circuitry comprising:
   protection circuitry coupled between a first reference voltage node and a second reference voltage node; and
   driver circuitry coupled between the first reference voltage node and the second reference voltage node, the driver circuitry having an output node;
an interface coupled to the output node of the driver circuitry; and
second domain circuitry coupled between a third reference voltage node and a fourth reference voltage node, the second domain circuitry including a transistor having a gate electrode coupled to the interface, wherein a body electrode of the transistor is coupled to the protection circuitry;
a second transistor coupled between the body electrode of the transistor and the fourth reference voltage node, wherein a gate electrode of the second transistor is coupled to the protection circuitry.

11. The semiconductor device of claim 10, wherein the protection circuity is configured to provide a first voltage corresponding to the first reference voltage node to the body electrode of the transistor and a second voltage corresponding to the second reference voltage node to the gate electrode of the second transistor in response to an electrostatic discharge event.

12. The semiconductor device of claim 8, further comprising an antiparallel diode arrangement coupled between the second reference voltage node and the fourth reference voltage node.

13. The semiconductor device of claim 8, wherein the second reference voltage node is coupled to the fourth reference voltage node.

14. A semiconductor device comprising:
first domain circuitry comprising:
   protection circuitry coupled between a first reference voltage node and a second reference voltage node; and
   driver circuitry coupled between the first reference voltage node and the second reference voltage node, the driver circuitry having an output node;
an interface coupled to the output node of the driver circuitry; and
second domain circuitry coupled between a third reference voltage node and a fourth reference voltage node, the second domain circuitry including a transistor having a gate electrode coupled to the interface, wherein a body electrode of the transistor is coupled to the protection circuitry;
wherein the protection circuitry includes a clamping arrangement coupled between the first reference voltage node and the second reference voltage node; and
the body electrode of the transistor is coupled to an input of the clamping arrangement.

15. The semiconductor device of claim 14, further comprising a second transistor coupled between the body electrode of the transistor and the fourth reference voltage node, wherein:
the protection circuitry comprises a triggering arrangement including inverter circuitry coupled between the first reference voltage node and the second reference voltage node, the inverter circuitry having an output coupled to the input of the clamping arrangement; and
a gate electrode of the second transistor is coupled to a second input of the inverter circuitry.

16. The semiconductor device of claim 15, wherein:
the triggering arrangement includes detection circuitry coupled between the first reference voltage node and the second reference voltage node; and
a second output of the detection circuitry is coupled to the second input of the inverter circuitry.

17. The semiconductor device of claim 15, further comprising an antiparallel diode arrangement coupled between the second reference voltage node and the fourth reference voltage node.

18. The semiconductor device of claim 8, wherein:
the second domain circuitry comprises receiver circuitry coupled between the third reference voltage node and the fourth reference voltage node; and
the receiver circuitry includes the transistor.

19. A method of fabricating a semiconductor device, the method comprising:
forming first domain circuitry on a semiconductor substrate, the first domain circuitry being coupled between a first reference voltage node and a second reference voltage node;
forming a transistor of second domain circuitry on the semiconductor substrate, the second domain circuitry being coupled between a third reference voltage node and a fourth reference voltage node;
forming a communications interface between an output node of driver circuitry of the first domain circuitry and a gate electrode of the transistor; and
providing an electrical connection between a body electrode of the transistor and a node of protection circuitry of the first domain circuitry.

* * * * *